(12) United States Patent
Wang

(10) Patent No.: US 8,786,098 B2
(45) Date of Patent: Jul. 22, 2014

(54) SEMICONDUCTOR ELEMENT HAVING CONDUCTIVE VIAS AND SEMICONDUCTOR PACKAGE HAVING A SEMICONDUCTOR ELEMENT WITH CONDUCTIVE VIAS AND METHOD FOR MAKING THE SAME

(75) Inventor: Meng-Jen Wang, Pingtung (TW)

(73) Assignee: Advanced Semiconductor Engineering, Inc. (TW)

( * ) Notice: Subject to any disclaimer, the term of this patent is extended or adjusted under 35 U.S.C. 154(b) by 473 days.

(21) Appl. No.: 13/092,866

(22) Filed: Apr. 22, 2011

(65) Prior Publication Data

US 2012/0086131 A1    Apr. 12, 2012

(30) Foreign Application Priority Data

Oct. 11, 2010    (TW) .............................. 099134620 A

(51) Int. Cl.
*H01L 23/48*    (2006.01)

(52) U.S. Cl.
USPC .................... 257/774; 438/107; 257/E23.011; 257/E21.499

(58) Field of Classification Search
USPC ............ 257/E23.011, 774, E21.597; 438/667
See application file for complete search history.

(56) References Cited

U.S. PATENT DOCUMENTS

| | | |
|---|---|---|
| 3,761,782 A | 9/1973 | Youmans |
| 4,394,712 A | 7/1983 | Anthony |
| 4,499,655 A | 2/1985 | Anthony |
| 4,807,021 A | 2/1989 | Okumura |
| 4,842,699 A | 6/1989 | Hua et al. |
| 4,897,708 A | 1/1990 | Clements |
| 4,982,265 A | 1/1991 | Watanabe et al. |
| 5,166,097 A | 11/1992 | Tanielian |
| 5,191,405 A | 3/1993 | Tomita et al. |
| 5,229,647 A | 7/1993 | Gnadinger |
| 5,239,448 A | 8/1993 | Perkins et al. |
| 5,308,443 A | 5/1994 | Sugihara |
| 5,404,044 A | 4/1995 | Booth et al. |
| 5,615,477 A | 4/1997 | Sweitzer |

(Continued)

FOREIGN PATENT DOCUMENTS

| | | |
|---|---|---|
| CN | 101638212 A | 2/2010 |
| CN | 101483149 B | 8/2010 |

(Continued)

*Primary Examiner* — S. V. Clark
*Assistant Examiner* — Krista Soderholm
(74) *Attorney, Agent, or Firm* — Morgan Law Offices, PLC

(57) ABSTRACT

The present invention relates to a semiconductor element having conductive vias and a semiconductor package having a semiconductor element with conductive vias and a method for making the same. The semiconductor element having conductive vias includes a silicon substrate and at least one conductive via. The thickness of the silicon substrate is substantially in a range from 75 to 150 μm. The conductive via includes a first insulation layer and a conductive metal, and the thickness of the first insulation layer is substantially in a range from 5 to 19 μm. Using the semiconductor element and the semiconductor package of the present invention, the electrical connection between the conductive via and the other element can be ensured, and the electrical connection between the silicon substrate and the other semiconductor element can be ensured, so as to raise the yield rate of a product. Moreover, by employing the method of the present invention, warpage and shift of the silicon substrate can be avoided during the reflow process, so as to conduct the reflow process only a single time in the method of the present invention, thereby simplifying the subsequent process and reducing cost.

18 Claims, 7 Drawing Sheets

(56) References Cited

U.S. PATENT DOCUMENTS

| | | |
|---|---|---|
| 5,643,831 A | 7/1997 | Ochiai et al. |
| 5,998,292 A | 12/1999 | Black et al. |
| 6,276,599 B1 | 8/2001 | Ogawa |
| 6,329,631 B1 | 12/2001 | Yueh |
| 6,406,934 B1 | 6/2002 | Glenn et al. |
| 6,448,506 B1 | 9/2002 | Glenn et al. |
| 6,457,633 B1 | 10/2002 | Takashima et al. |
| 6,577,013 B1 | 6/2003 | Glenn et al. |
| 6,670,269 B2 | 12/2003 | Mashino |
| 6,699,787 B2 | 3/2004 | Mashino |
| 6,740,950 B2 | 5/2004 | Paek |
| 6,812,549 B2 | 11/2004 | Umetsu et al. |
| 6,815,348 B2 | 11/2004 | Mashino |
| 6,962,829 B2 | 11/2005 | Glenn et al. |
| 7,078,269 B2 | 7/2006 | Yamasaki et al. |
| 7,134,198 B2 | 11/2006 | Nakatani |
| 7,157,372 B1 | 1/2007 | Trezza |
| 7,215,032 B2 | 5/2007 | Trezza |
| 7,222,420 B2 | 5/2007 | Moriizumi |
| 7,238,590 B2 | 7/2007 | Yang et al. |
| 7,262,475 B2 | 8/2007 | Kwon et al. |
| 7,276,787 B2 | 10/2007 | Edelstein et al. |
| 7,285,434 B2 | 10/2007 | Yee et al. |
| 7,298,030 B2 | 11/2007 | McWilliams et al. |
| 7,334,326 B1 | 2/2008 | Huemoeller et al. |
| 7,365,436 B2 | 4/2008 | Yamano |
| 7,371,602 B2 | 5/2008 | Yee |
| 7,388,293 B2 | 6/2008 | Fukase et al. |
| 7,415,762 B2 | 8/2008 | Fukase et al. |
| 7,482,272 B2 | 1/2009 | Trezza |
| 7,508,057 B2 | 3/2009 | Shiraishi et al. |
| 7,508,079 B2 | 3/2009 | Higashi |
| 7,528,053 B2 | 5/2009 | Huang et al. |
| 7,538,033 B2 | 5/2009 | Trezza |
| 7,553,752 B2 | 6/2009 | Kuan et al. |
| 7,560,744 B2 | 7/2009 | Hsiao et al. |
| 7,598,163 B2 | 10/2009 | Callahan et al. |
| 7,605,463 B2 | 10/2009 | Sunohara |
| 7,625,818 B2 | 12/2009 | Wang |
| 7,642,132 B2 | 1/2010 | Huang et al. |
| 7,656,023 B2 | 2/2010 | Sunohara et al. |
| 7,659,202 B2 | 2/2010 | Trezza |
| 7,666,711 B2 | 2/2010 | Pagaila et al. |
| 7,678,685 B2 | 3/2010 | Sunohara et al. |
| 7,681,779 B2 | 3/2010 | Yang |
| 7,687,397 B2 | 3/2010 | Trezza |
| 7,691,747 B2 | 4/2010 | Lin et al. |
| 7,733,661 B2 | 6/2010 | Kossives et al. |
| 7,741,148 B1 | 6/2010 | Marimuthu et al. |
| 7,741,152 B2 | 6/2010 | Huang et al. |
| 7,741,156 B2 | 6/2010 | Pagaila et al. |
| 7,772,081 B2 | 8/2010 | Lin et al. |
| 7,772,118 B2 | 8/2010 | Yamano |
| 7,786,008 B2 | 8/2010 | Do et al. |
| 7,786,592 B2 | 8/2010 | Trezza |
| 7,795,140 B2 | 9/2010 | Taguchi et al. |
| 7,808,060 B2 | 10/2010 | Hsiao |
| 7,808,111 B2 | 10/2010 | Trezza |
| 7,811,858 B2 | 10/2010 | Wang et al. |
| 7,816,265 B2 | 10/2010 | Wang |
| 7,842,597 B2 | 11/2010 | Tsai |
| 2002/0017855 A1 | 2/2002 | Cooper et al. |
| 2002/0094605 A1 | 7/2002 | Pai et al. |
| 2004/0124518 A1 | 7/2004 | Karnezos |
| 2004/0259292 A1 | 12/2004 | Beyne et al. |
| 2005/0189635 A1 | 9/2005 | Humpston et al. |
| 2005/0258545 A1 | 11/2005 | Kwon |
| 2006/0027632 A1 | 2/2006 | Akram |
| 2006/0197216 A1 | 9/2006 | Yee |
| 2007/0048896 A1 | 3/2007 | Andry et al. |
| 2007/0138562 A1 | 6/2007 | Trezza |
| 2007/0187711 A1 | 8/2007 | Hsiao et al. |
| 2008/0272486 A1 | 11/2008 | Wang et al. |
| 2009/0032928 A1 | 2/2009 | Chiang et al. |
| 2009/0039527 A1 | 2/2009 | Chan et al. |
| 2009/0140436 A1 | 6/2009 | Wang |
| 2009/0146297 A1 | 6/2009 | Badakere et al. |
| 2009/0166785 A1 | 7/2009 | Camacho et al. |
| 2009/0243045 A1 | 10/2009 | Pagaila et al. |
| 2009/0294959 A1 | 12/2009 | Chiang et al. |
| 2009/0302435 A1 | 12/2009 | Pagaila et al. |
| 2009/0302437 A1 | 12/2009 | Kim et al. |
| 2009/0309235 A1 | 12/2009 | Suthiwongsunthorn et al. |
| 2009/0321916 A1 | 12/2009 | Wang et al. |
| 2010/0059855 A1 | 3/2010 | Lin et al. |
| 2010/0065948 A1 | 3/2010 | Bae et al. |
| 2010/0133704 A1 | 6/2010 | Marimuthu et al. |
| 2010/0140737 A1 | 6/2010 | Lin et al. |
| 2010/0140751 A1 | 6/2010 | Tay et al. |
| 2010/0140752 A1 | 6/2010 | Marimuthu et al. |
| 2010/0140776 A1 | 6/2010 | Trezza |
| 2010/0148316 A1 | 6/2010 | Kim et al. |
| 2010/0187681 A1 | 7/2010 | Chen et al. |
| 2010/0197134 A1 | 8/2010 | Trezza |
| 2010/0200961 A1* | 8/2010 | Chauhan ............. 257/621 |
| 2010/0230759 A1 | 9/2010 | Yang et al. |
| 2010/0230760 A1 | 9/2010 | Hung |
| 2010/0230788 A1 | 9/2010 | Peng |
| 2010/0244244 A1 | 9/2010 | Yang |
| 2010/0276690 A1 | 11/2010 | Chen |
| 2010/0327465 A1 | 12/2010 | Shen et al. |
| 2011/0048788 A1 | 3/2011 | Wang et al. |
| 2011/0068437 A1 | 3/2011 | Chiu et al. |
| 2011/0133342 A1* | 6/2011 | Arai ............... 257/774 |

FOREIGN PATENT DOCUMENTS

| | | |
|---|---|---|
| JP | 2002246540 A | 8/2002 |
| JP | 2004228135 A | 8/2004 |
| TW | 200612539 A | 4/2006 |

* cited by examiner

SEMICONDUCTOR ELEMENT HAVING CONDUCTIVE VIAS AND SEMICONDUCTOR PACKAGE HAVING A SEMICONDUCTOR ELEMENT WITH CONDUCTIVE VIAS AND METHOD FOR MAKING THE SAME

CROSS-REFERENCE TO RELATED APPLICATIONS

This application claims the benefit of Taiwan application Serial No. 099134620, filed Oct. 11, 2010, the subject matter of which is incorporated herein by reference.

BACKGROUND OF THE INVENTION

1. Field of the Invention

The present invention relates to the field of semiconductor packaging, and, more particularly, to the use of conductive vias in semiconductor packages.

2. Description of the Related Art

In recent years, through silicon via (TSV) has become an increasingly popular technique in the field of 3-D semiconductor packaging. In TSV, chips can be stacked on top of one another, and connected using conductive vias which are vertical pathways of interconnects that run through the chips.

Conventionally, a silicon substrate will include a plurality of through holes in which the conductive vias are formed. To avoid placing conductive metal directly on the silicon, each of the conductive vias includes an insulation layer on the sidewall and conductive metal is disposed within the hole. However, problems can occur if the insulation layer is not the proper thickness. For example, if the insulation layer is too thick, it may expand due to heat to such an extent that it interferes with a redistribution layer (RDL). Furthermore, various problems can occur if the silicon substrate is not of an optimal thickness.

SUMMARY OF THE INVENTION

One aspect of the disclosure relates to a semiconductor element. In one embodiment, a semiconductor element includes a silicon substrate having a plurality of through holes, each of the through holes including a conductive via formed therein, wherein the conductive via includes an insulation layer disposed on a side wall of the through hole, defining a central hole, the central hole including a conductive metal disposed therein. For at least one of the through holes, a difference between the radius of the through hole and a radius of a central hole within the through hole is substantially in a range from 5 to 19 μm. The thickness of the silicon substrate is substantially in a range from 75 to 150 μm.

Another aspect of the disclosure relates to a semiconductor package. In one embodiment, a semiconductor package includes: (1) a silicon substrate, having a plurality of through holes, each of the through holes including a conductive via formed therein, wherein the conductive via includes an insulation layer disposed on a side wall of the through hole, defining a central hole, the central hole including a conductive metal disposed therein; and (2) at least one chip, disposed on the semiconductor element, and electrically connected to the conductive vias of the semiconductor element. For at least one of the through holes, a difference between the radius of the through hole and a radius of a central hole within the through hole is substantially in a range from 5 to 19 μm. The thickness of the silicon substrate is substantially in a range from 75 to 150 μm.

Another aspect of the disclosure relates to manufacturing methods. In one embodiment, a manufacturing method includes: (1) providing a carrier; (2) disposing a semiconductor element on the carrier, wherein the semiconductor element comprises a silicon substrate and conductive vias, the silicon substrate has a first surface, a second surface and through holes, the through holes penetrate the silicon substrate, the thickness of the silicon substrate is substantially in a range from 75 to 150 μm, the conductive vias penetrate the silicon substrate and comprise a first insulation layer and a conductive metal, the first insulation layer is disposed on a side wall of each of the through holes and defines a central hole, and the conductive metal is disposed in the central hole; (3) disposing a plurality of chips on the semiconductor element; and (4) conducting a reflow process.

In the present invention, the difference between a first radius of each of the through holes and a second radius of the first central hole is substantially in a range from 5 to 19 μm, which prevents first metal pads covered on the first insulation layer from breaking or being overly thin, so an electrical connection between the conductive vias and the other element can be ensured. Moreover, the thickness of the silicon substrate is between 75 and 150 μm, so during a process of electrically connecting the silicon substrate of the present invention and the other semiconductor element, the shift of the silicon substrate caused by warpage of the silicon substrate during a heat process can be avoided, and the electrical connection between the silicon substrate and the chip can be ensured, so as to raise at least one yield rate of a product.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION OF THE INVENTION

Figure 1A:
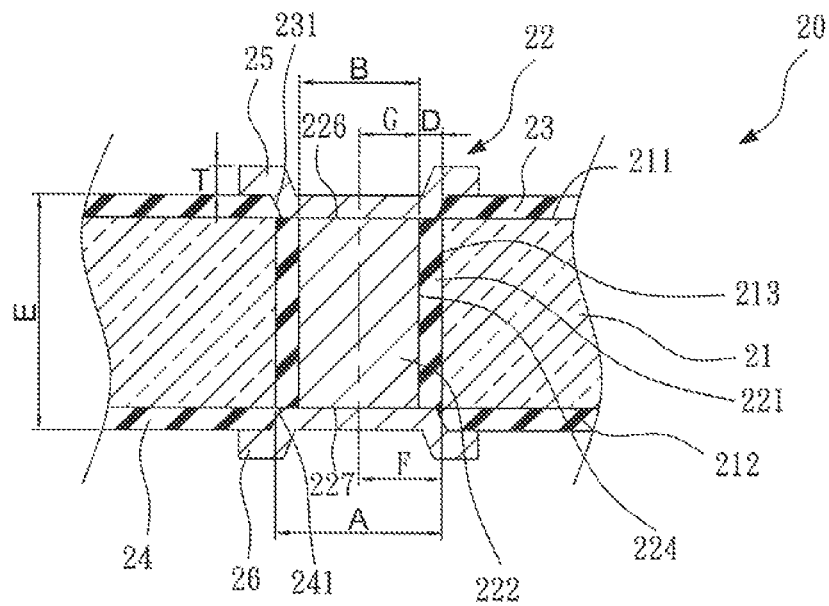
FIG. 1A and FIG. 1B show a cross-sectional view and a top view of a semiconductor element having conductive vias according to an embodiment of the present invention.
Figure 1B:
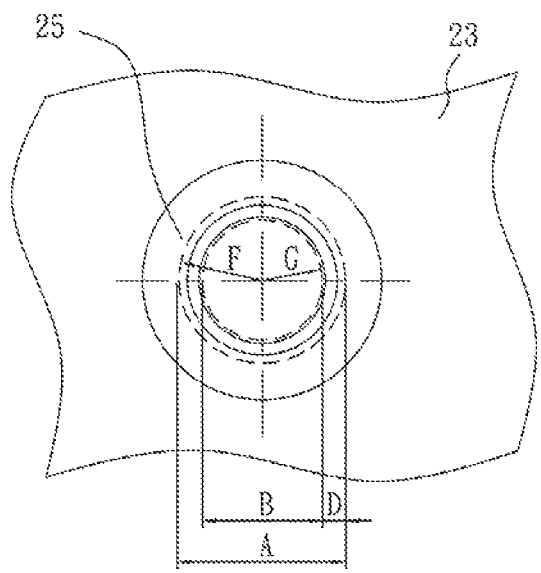

Referring to FIG. 1A and FIG. 1B, a cross-sectional view and a top view of a semiconductor element having conductive vias according to an embodiment of the present invention are illustrated, respectively. A semiconductor element 20 comprises a silicon substrate 21 and conductive vias 22. The silicon substrate 21 has a first surface 211, a second surface 212 and through holes 213 which penetrate the silicon substrate 21. The thickness (E) of the silicon substrate 21 should be at least about 75 μm, preferably, substantially in a range from 75 to 150 μm.

The conductive vias 22 are formed within the through holes 213. Each of the conductive vias 22 comprises a first insulation layer 221 and a conductive metal 222, the first insulation layer 221 disposed on a side wall of the through hole 213, defining a first central hole 224. The conductive metal 222 is disposed in the first central hole 224. The first insulation layer 221 can be made of a polymer material with a CTE (Coefficient of Thermal Expansion) value in a range of 20~50 ppm/° C., such as epoxy resin, molding compound, bismaleimide-triazine (BT) resin, build-up layer, interlayer dielectric film, Ajinomoto Build-Up Film (ABF), underfill, benzocyclobutene (BCB) or polyimide (PI). The difference (D) between a first radius (F) of the through hole 213 and a second radius (G) of the first central hole 224 is substantially in a range from 5 to 19 μm, preferably, substantially in a range from 7.5 to 12 μm. Diameter (B) of the conductive metal 222 may be substantially in a range from 12 to 40 μm, and diameter (A) of the conductive via 22 is preferably substantially in a range from 25 to 50 μm.

In this embodiment, the conductive via 22 has a first end portion 226 and a second end portion 227, the first end portion 226 is exposed to the first surface 211 of the silicon substrate 21, and the second end portion 227 is exposed to the second surface 212 of the silicon substrate 21.

In this embodiment, the semiconductor element 20 further comprises a first passivation layer 23, a second passivation layer 24; first metal pads 25 and second metal pads 26. The first passivation layer 23 and the first metal pads 25 are disposed on the first surface 211, and the second passivation layer 24 and the second metal pads 26 are disposed on the second surface 212. The first passivation layer 23 has first openings 231 so as to expose the first end portion 226 of each of the conductive vias 22, and the second passivation layer 24 has second openings 241 so as to expose the second end portion 227 of each of the conductive vias 22. In this embodiment, each of the first metal pads 25 is disposed in each of the first openings 231, and electrically connected to the first end portion 226 of each of the conductive vias 22. Each of the second metal pads 26 is disposed in each of the second openings 232, and electrically connected to the second end portion 227 of each of the conductive vias 22. The thickness (T) of the first metal pads 25 and the second metal pads 26 should be at least about 4.5 μm.

In regard to this embodiment, after performing various reliability tests, it was shown that when the difference (D) between the first radius (F) of the through hole 213 and the second radius (G) of the first central hole 224 is substantially in a range from 5 to 19 μm, preferably, in a range from 7.5 to 12 μm, the problems caused by conventional technology can be avoided. Such problems include the first insulation layer being too thick, the first insulation layer being too large after being heated and expanded, the redistribution layer (RDL) covered on the first insulation layer being broken or becoming thinner, and a faulty electrical connection or open circuit being formed. The reliability tests also established that that when the thickness (T) of the first metal pads 25 and of the second metal pads 26 is equal to about 4.5 μm or larger, the problems caused by conventional technology can be avoided.

In this embodiment, after performing various reliability tests with the silicon substrate having different thicknesses, the results show that when the thickness (E) of the silicon substrate 21 is substantially in a range from 75 to 150 μm, warpage problems caused by silicon substrate being too thin can be avoided. Therefore, using the semiconductor element 20 of the present invention can simplify the subsequent process and reduce cost.

Furthermore, using the semiconductor element 20 of the present invention can also solve the problems of conventional technology regarding increased electrical loss of the conductive via and significant capacitance effect due to excessive thickness of the silicon substrate.

Figure 2:
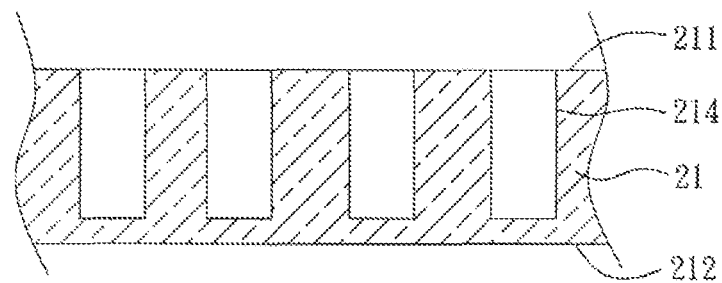
FIGS. 2 to 6 show cross-sectional views of a method for making the semiconductor element according to an embodiment of the present invention.

Referring to FIGS. 2 to 6, cross-sectional views of a method for making a semiconductor element according to the first embodiment of the present invention are illustrated. Referring to FIG. 2, the silicon substrate 21 is provided. The silicon substrate 21, for example, a wafer, has the first surface 211, the second surface 212 and a plurality of holes 214. In this embodiment, the silicon substrate 21 is made from semiconductor material, such as silicon or germanium, and the holes 214 are blind holes and open at the first surface 211. In this embodiment, the silicon substrate 21 can be a function die, such as a processor or a memory die, or an interposer.

In other embodiments, the holes 214 can be through holes that penetrate through the silicon substrate 21. The holes 214 in the silicon substrate 21 are made by different ways, such as laser drill, plasma etching through a mask or chemical etching.

Figure 3:
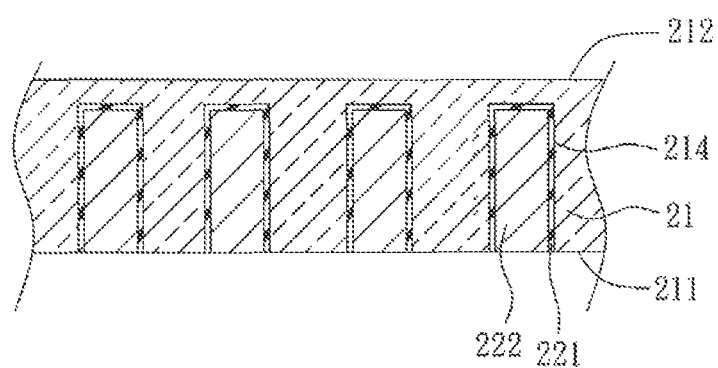

Referring to FIG. 3, an insulation material 221, e.g., a non-conductive polymer with a CTE (Coefficient of Thermal Expansion) value in a range of 20~50 ppm/° C., such as polyimide (PI), epoxy or benzocyclobutene (BCB); and a conductive material 222, e.g., copper, are formed inside the holes 214. The insulation material 221 is formed between the silicon substrate 21 and the conductive material 222. In this embodiment, the insulation material 221 can be applied by a laminating process or a spin coating process; the conductive material 222 can be formed by electroplating.

Figure 4:
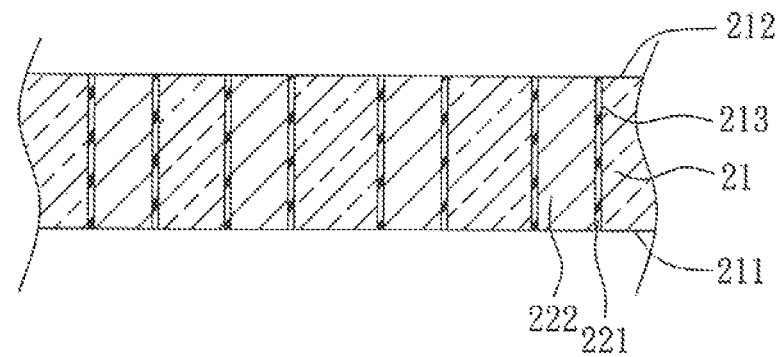

Referring to FIG. 4, the silicon substrate 21 is thinned by removing part of the second surface 212 such as by grinding and/or etching, so that the holes 214 become a plurality of the through holes 213 and the conductive material 222 and the insulation material 221 are exposed and a plurality of the conductive vias 22 are formed.

Figure 5:
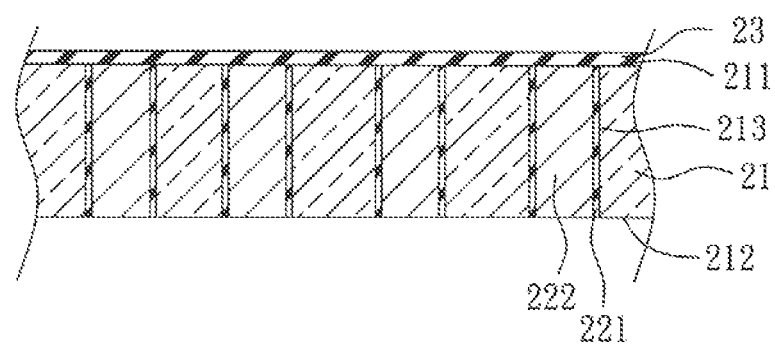

Referring to FIG. 5, the first passivation layer 23 is formed on the first surface 211 by a laminating process or a spin coating process. The first passivation layer 23 may be a non-conductive polymer such as polyimide, epoxy or benzocyclobutene. In this embodiment, the first passivation layer 23 can be a photo sensitive polymer such as benzocyclobutene, and can be formed by spin coating or spray coating.

Figure 6:
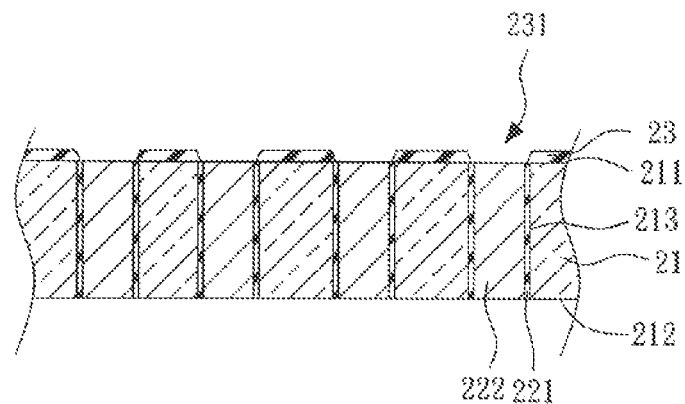

Referring to FIG. 6, a photolithography process can be used to form the first openings 231 and exposing the conductive vias 22. The size and position of the openings are defined by the mask used in the photolithography process.

Referring to FIG. 1 again, then, a second passivation layer 24 is formed on the second surface 212 by a laminating process or a spin coating process. The second passivation layer 24 may be a non-conductive polymer such as polyimide, epoxy or benzocyclobutene. In this embodiment, the second passivation layer 24 is a photo sensitive polymer such as benzocyclobutene, and can be formed by spin coating or spray coating. Next, photolithography is utilized to form second openings 241 exposing the conductive vias 22. The size and position of the openings are defined by the mask used in the photolithography. Thereafter, the first metal pads 25 are formed in the first openings 231, and electrically connected to the first end portion 226 of each of the conductive vias 22. The second metal pads 26 are formed in the second openings 241, and electrically connected to the second end portion 227 of each of the conductive vias 22.

Figure 7:
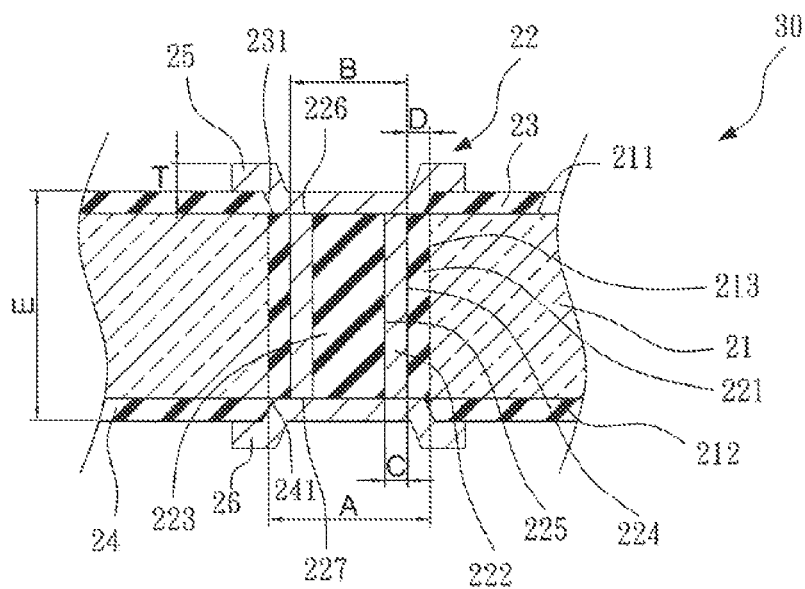
FIG. 7 is a cross-sectional view of a semiconductor element having conductive vias according to another embodiment of the present invention.
Figure 8:
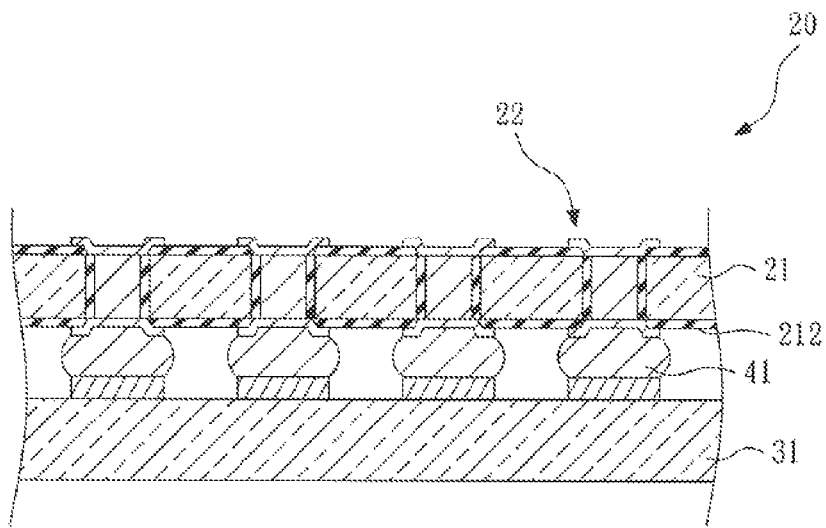
FIGS. 8 to 12 are cross-sectional views of a method for making a semiconductor package having a semiconductor element with conductive vias according to another embodiment of the present invention.

Referring to FIG. 7, a cross-sectional view of a semiconductor element having conductive vias according to another embodiment of the present invention is illustrated. The semiconductor device 30 of this embodiment is substantially the same as the semiconductor device 20 (FIG. 1), and the same elements are designated with the same reference numerals. The difference between the semiconductor device 30 and the semiconductor device 20 is that the conductive metal 222 has a hollow cylinder structure, the hollow cylinder structure defines a second central hole 225, and each of the conductive vias 22 further comprises a second insulation 223 disposed in the second central hole 225. The second insulation 223 may be a polymer. The material cost of polymer is generally less than the material cost of conductive metals such as copper and, thus, plating the walls of the cylinder structure with conductive metal and filling the remainder of the cylinder structure with a polymer could save material costs. Further, the second insulation 223 could also serve to protect the conductive metal 222 from oxidation. Thickness (C) of the hollow cylinder structure should be at least about 6 μm. The diameter (B) of the conductive metal 222 (including the hollow cylinder structure and the second insulation layer 223) should be substantially in a range from 12 to 40 μm.

FIGS. 8 to 12 show cross-sectional views of a method for making a semiconductor package having a semiconductor element with conductive vias according to the present invention. First, referring to FIG. 8, a semiconductor element is disposed on a carrier 31. In this embodiment, the semiconductor element is the semiconductor element 20, however, in other embodiment, the semiconductor element may be the semiconductor element 30. The conductive vias 22 are electrically connected to the carrier 31 through a plurality of first bumps 41. In this embodiment, the plurality of first bumps 41 are disposed on the second surface 212 of the silicon substrate 21 and the carrier can be a silicon substrate body or an organic substrate body. However, in other embodiments, the carrier 31 may not be needed.

Figure 9:
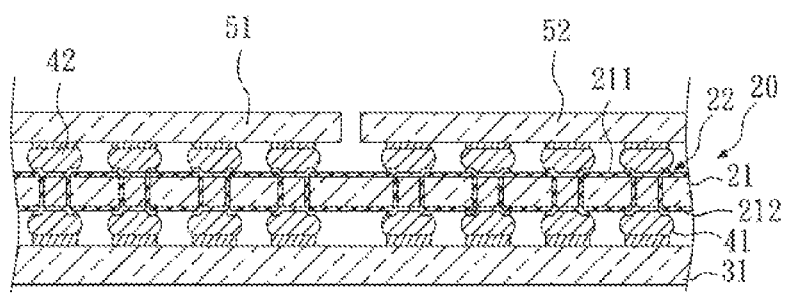
Figure 10:
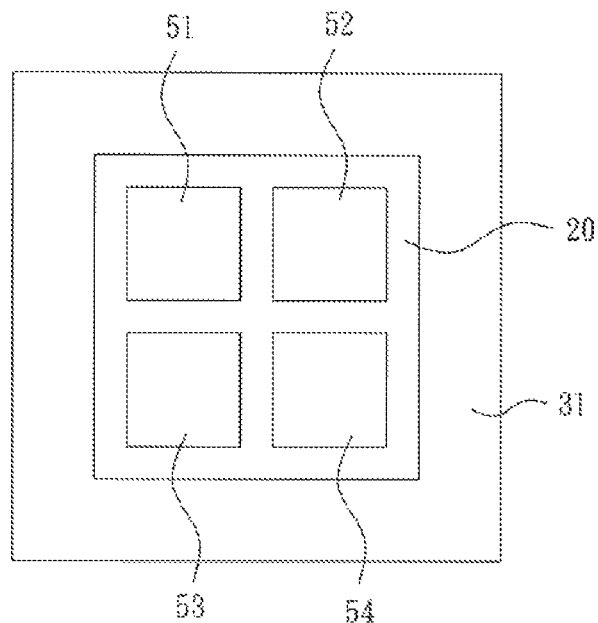

Referring to FIG. 9, a plurality of chips 51, 52 are disposed on the semiconductor element 20. In this embodiment, the conductive vias 22 are electrically connected to the chips 51, 52 through the plurality of second bumps 42. Referring to FIG. 10, a top view of disposing a plurality of chips on the semiconductor element is illustrated. In this embodiment, there are four chips 51, 52, 53, 54 disposed on the same semiconductor element 20. In other embodiments, there may be only one chip, two or more chips disposed on one semiconductor element.

Then, a reflow process is conducted. In this embodiment, the semiconductor element 20 is disposed on the carrier 31, and the four chips 51, 52, 53, 54 are further disposed on the semiconductor element 20. As described above, the thickness (E) of the silicon substrate 21 of the semiconductor element 20 is substantially in a range from 75 to 150 μm, so that the reflow process can be safely conducted.

Figure 11:
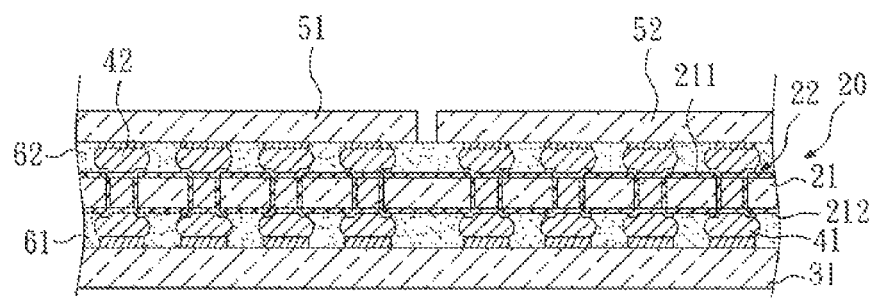

Referring to FIG. 11, the chips 51, 52, the semiconductor element 20 and the carrier 31 are stacked. In this embodiment, a first underfill 61 is disposed between the semiconductor element 20 and the carrier 31, and a second underfill 62 is disposed between the semiconductor element 20 and the chips 51, 52, so as to encapsulate the first bumps 41 and the second bumps 42.

Figure 12:
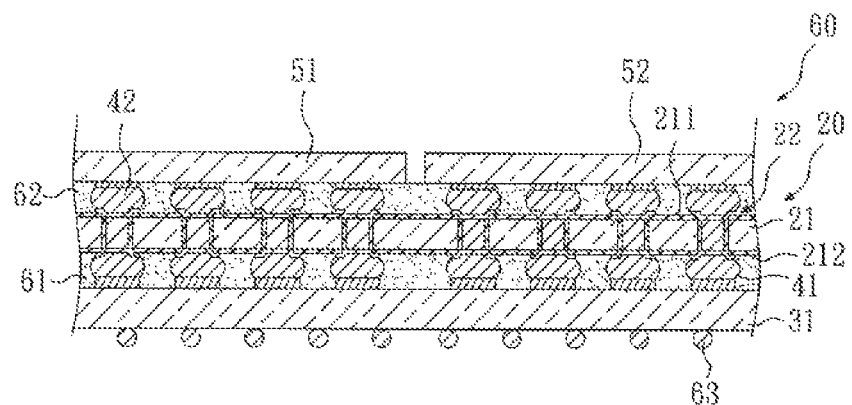

Referring to FIG. 12, a plurality of conductive balls 63 are disposed on the carrier 31 and the semiconductor package 60 having a semiconductor element with conductive vias of the present invention is formed. A semiconductor package 60 of the present invention comprises the carrier 31, the semiconductor element 20 and at least one chip (FIG. 12 shows two chips 51, 52). The semiconductor element 20 is disposed on the carrier 31, and the carrier 31 can be a silicon substrate body or an organic substrate body. In this embodiment, the semiconductor element is the semiconductor element 20, however, in other embodiment, the semiconductor element may be the semiconductor element 30. The chips 51, 52 are disposed on the semiconductor element 20, and electrically connected to the conductive vias 22 of the semiconductor element 20.

The semiconductor package 60 of the present invention further comprises a plurality of the first bumps 41 disposed on the second surface 212 of the silicon substrate 21, so as to electrically connect the conductive vias 22 to the carrier 31. Also, the semiconductor package 60 of the present invention further comprises a plurality of second bumps 42 disposed on the first surface 211 of the silicon substrate 21, so as to electrically connect the conductive vias 22 to the chips 51, 52. The semiconductor package 60 of the present invention further comprises a first underfill 61 disposed between the semiconductor element 20 and the carrier 31, and a second underfill 62 disposed between the semiconductor element 20 and the chips 51, 52, so as to encapsulate the first bumps 41 and the second bumps 42.

Figure 13:
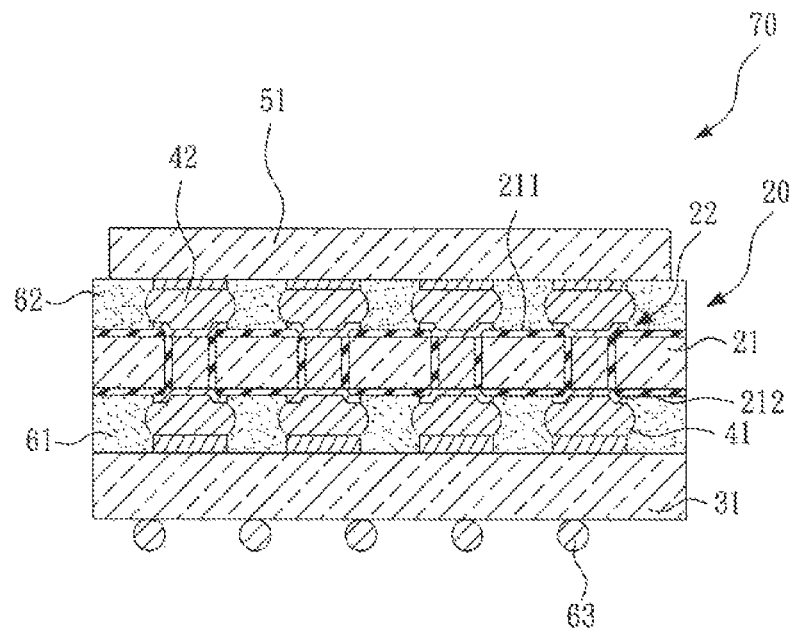
FIG. 13 is a cross-sectional view of a semiconductor package having a single chip and a semiconductor element with conductive vias according to an embodiment of the present invention.

Referring to FIG. 13, a cross-sectional view of a semiconductor package having a single chip and a semiconductor element with conductive vias according to the present invention. In this embodiment, semiconductor package 70 of the present invention comprises the carrier 31, the semiconductor element 20 and the chip 51. The semiconductor package 70 of this embodiment is substantially the same as the semiconductor package 60 (FIG. 12), and the same elements are designated with the same reference numerals. The difference between the semiconductor package 70 and the semiconductor package 60 is that the number of chips of semiconductor package 70 is one (chip 51). In this embodiment, a sawing process is conducted after the reflow process so as to form the semiconductor package 70. In this embodiment, after the sawing process the size of the chip 51 may be equal to or smaller than the size of the semiconductor element 20.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor element, comprising:
   a silicon substrate, having a plurality of through holes, each of the through holes including a conductive via formed therein, wherein the conductive via includes an insulation layer disposed on a side wall of the through hole, defining a first central hole, the first central hole including a conductive metal disposed therein;
   wherein, for at least one of the through holes, a difference between the radius of the through hole and a radius of the first central hole within the through hole is substantially in a range from 5 to 19 µm; and
   wherein the conductive metal forms a hollow cylinder structure, the hollow cylinder structure defining a second central hole, and each of the conductive vias further comprises a second insulation layer disposed in the second central hole.

2. The semiconductor element as claimed in claim 1, wherein a thickness of the silicon substrate is substantially in a range from 75 to 150 µm.

3. The semiconductor element as claimed in claim 1, wherein a diameter of at least one of the conductive vias is substantially in a range from 25 to 50 µm.

4. The semiconductor element as claimed in claim 1, wherein a thickness of the conductive metal is greater than or equal to about 6 µm.

5. The semiconductor element as claimed in claim 1, further comprising a passivation layer, wherein the passivation layer has a plurality of openings and a plurality of metal pads, wherein each of the metal pads is disposed in each of the openings, and electrically connected to the conductive metal.

6. The semiconductor element as claimed in claim 5, wherein a thickness of each of the metal pads is greater than or equal to about 4.5 µm.

7. The semiconductor element as claimed in claim 1, wherein a diameter of the conductive metal is substantially in a range from 12 to 40 µm.

8. A semiconductor package having a semiconductor element, comprising:
   a silicon substrate, having a plurality of through holes, each of the through holes including a conductive via formed therein, wherein the conductive via includes an insulation layer disposed on a side wall of the through hole, defining a first central hole, the first central hole including a conductive metal disposed therein; and
   at least one chip, disposed on the semiconductor element, and electrically connected to the conductive vias of the semiconductor element;
   wherein, for at least one of the through holes, a difference between the radius of the through hole and a radius of the first central hole within the through hole is substantially in a range from 5 to 19 µm; and
   wherein the conductive metal forms a hollow cylinder structure, the hollow cylinder structure defining a second central hole, and each of the conductive vias further comprises a second insulation layer disposed in the second central hole.

9. The semiconductor package as claimed in claim 8, wherein a thickness of the silicon substrate is substantially in a range from 75 to 150 µm.

10. The semiconductor package as claimed in claim 8, wherein a diameter of at least one of the conductive vias is substantially in a range from 25 to 50 µm.

11. The semiconductor package as claimed in claim 8, wherein the semiconductor element further comprises:
    a first passivation layer, disposed on a first surface, and having a plurality of first openings;
    a second passivation layer, disposed on a second surface, and having a plurality of second openings;
    a plurality of first metal pads, wherein each of the first metal pads is disposed in each of the first openings, and electrically connected to the conductive metal; and
    a plurality of second metal pads, wherein each of the first metal pads is disposed in each of the second openings, and electrically connected to the conductive metal.

12. The semiconductor package as claimed in claim 11, wherein the thickness of each of the first metal pads or each of the second metal pads is greater than or equal to about 4.5 µm.

13. The semiconductor package as claimed in claim 8, further comprising a carrier, wherein the semiconductor element is disposed on the carrier and the carrier is a silicon substrate body or an organic substrate body.

14. The semiconductor package as claimed in claim 8, wherein a diameter of the conductive metal is substantially in a range from 12 to 40 µm.

15. A method for making a semiconductor package having a semiconductor element with conductive vias, comprising:
    (a) providing a carrier;
    (b) disposing a semiconductor element on the carrier, wherein the semiconductor element comprises a silicon substrate and conductive vias, the silicon substrate has a first surface, a second surface and through holes, the through holes penetrate the silicon substrate, the thickness of the silicon substrate is substantially in a range from 75 to 150 µm, the conductive vias penetrate the silicon substrate and each of the conductive vias comprises a first insulation layer and a conductive metal, the first insulation layer is disposed on a side wall of each of the through holes and defines a first central hole, and the conductive metal is disposed in the first central hole;
    wherein, for at least one of the through holes, a difference between the radius of the through hole and a radius of the first central hole within the through hole is substantially in a range from 5 to 19 µm; and
    wherein the conductive metal forms a hollow cylinder structure, the hollow cylinder structure defining a second central hole, and each of the conductive vias further comprises a second insulation layer disposed in the second central hole;
    (c) disposing a plurality of chips on the semiconductor element; and
    (d) conducting a reflow process.

16. The method as claimed in claim 15, wherein in step (b), the conductive vias and the carrier are electrically connected by a plurality of first bumps.

17. The method as claimed in claim 15, wherein in step (c), the conductive vias and the chips are electrically connected by a plurality of second bumps.

18. The method as claimed in claim 15, further comprising:
    (e) applying a first underfill between the semiconductor element and the carrier; and
    (f) applying a second underfill between the semiconductor element and the chips.

* * * * *